(12) United States Patent
Tagami et al.

(10) Patent No.: US 9,741,915 B2
(45) Date of Patent: Aug. 22, 2017

(54) LED MODULE HAVING LED ELEMENT CONNECTED TO METAL LAYER EXPOSED BY OPENING IN MULTI-LAYER RESIST

(71) Applicant: Panasonic Intellectual Property Management Co., Ltd., Osaka (JP)

(72) Inventors: Naoki Tagami, Miyagi (JP); Masumi Abe, Osaka (JP); Hisaki Fujitani, Kyoto (JP); Kosuke Takehara, Osaka (JP); Toshiaki Kurachi, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/220,790

(22) Filed: Jul. 27, 2016

(65) Prior Publication Data

US 2017/0040508 A1    Feb. 9, 2017

(30) Foreign Application Priority Data

Aug. 3, 2015    (JP) .................................. 2015-153715

(51) Int. Cl.
*H01L 33/54*    (2010.01)
*H01L 33/62*    (2010.01)
*H01L 33/60*    (2010.01)

(52) U.S. Cl.
CPC .............. *H01L 33/62* (2013.01); *H01L 33/60* (2013.01); *H01L 2224/48091* (2013.01); *H01L 2224/48228* (2013.01); *H01L 2224/73265* (2013.01); *H01L 2924/181* (2013.01)

(58) Field of Classification Search
None
See application file for complete search history.

(56) References Cited

U.S. PATENT DOCUMENTS

| 2010/0027261 | A1* | 2/2010 | Yashima | C09J 7/0282 |
| | | | | 362/249.02 |
| 2012/0244351 | A1* | 9/2012 | Katagi | B32B 7/12 |
| | | | | 428/355 N |
| 2014/0104850 | A1 | 4/2014 | Yamamoto et al. | |
| 2014/0217379 | A1* | 8/2014 | Humphries | C08G 61/12 |
| | | | | 257/40 |
| 2014/0306259 | A1* | 10/2014 | Liu | H01L 33/56 |
| | | | | 257/99 |

(Continued)

FOREIGN PATENT DOCUMENTS

| JP | 2011-066267 | 3/2011 |
| JP | 2011-176017 | 9/2011 |
| JP | 2013-004815 | 1/2013 |

(Continued)

*Primary Examiner* — Bilkis Jahan
(74) *Attorney, Agent, or Firm* — Renner, Otto, Boisselle & Sklar

(57) ABSTRACT

A light emitting diode (LED) module including: a substrate; a resist including a plurality of layers above the substrate; and an LED element mounted above the substrate. A content percentage of at least one of a phenyl group, an ester bond, and a carbon double bond in a second layer that is an uppermost layer of the plurality of layers is lower than a content percentage of the at least one of the phenyl group, the ester bond, and the carbon double bond in a first layer that is an underlying layer of the plurality of layers, the underlying layer being located below the uppermost layer.

9 Claims, 4 Drawing Sheets

(56) References Cited

U.S. PATENT DOCUMENTS

2015/0249194 A1 9/2015 Yamamoto et al.
2016/0072026 A1* 3/2016 Kanaumi ............. H01L 33/507
                                                                257/98

FOREIGN PATENT DOCUMENTS

| JP | WO2014041861 A1 * | 3/2014 | ............. H01L 33/50 |
| JP | 2014-146685 | 8/2014 | |
| WO | WO 2014/030313 A1 | 2/2014 | |

* cited by examiner

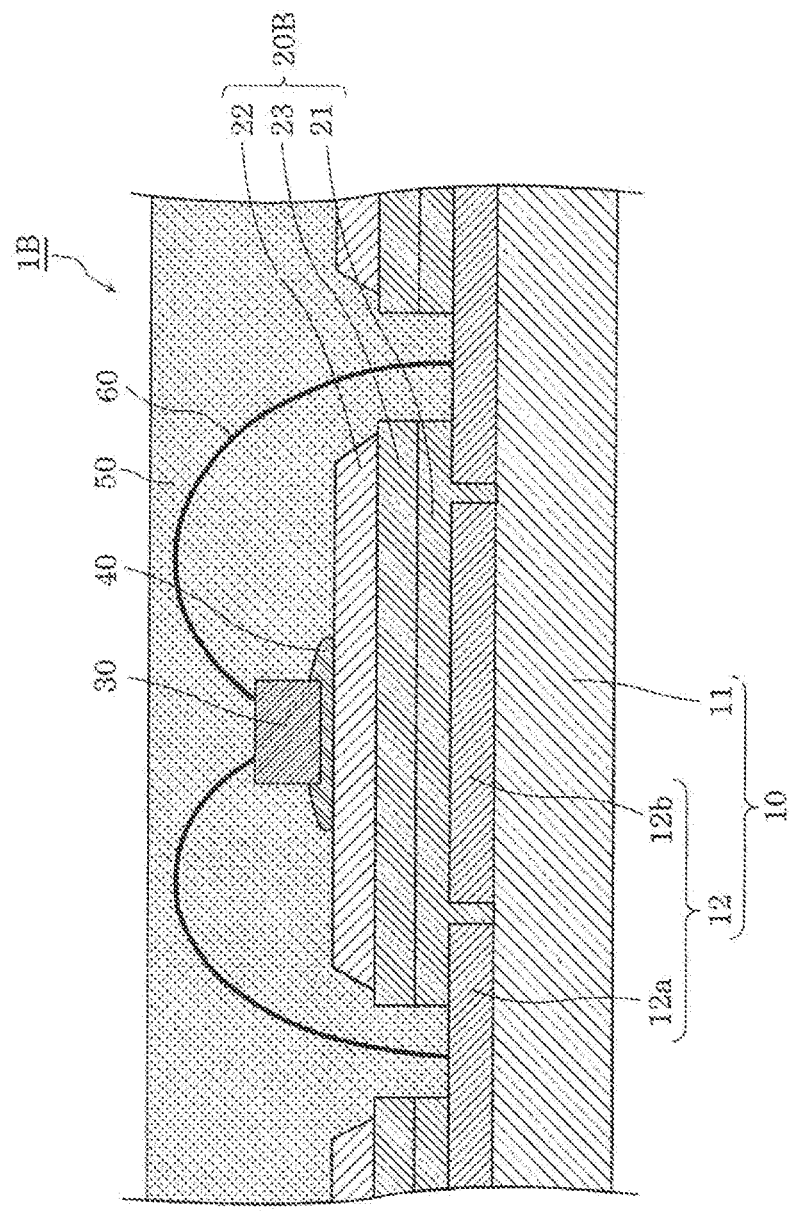

LED MODULE HAVING LED ELEMENT CONNECTED TO METAL LAYER EXPOSED BY OPENING IN MULTI-LAYER RESIST

CROSS REFERENCE TO RELATED APPLICATION

This application claims the benefit of priority of Japanese Patent Application Number 2015-153715 filed on Aug. 3, 2015, the entire content of which is hereby incorporated by reference.

BACKGROUND

1. Technical Field

The present disclosure relates to a light emitting diode (LED) module including an LED.

2. Description of the Related Art

Semiconductor light-emitting elements such as LEDs are highly efficient and long-life elements, and thus widely used as light sources for various devices. An LED is used, for example, as an illumination light source in a lamp, a lighting device, etc., or as a backlight light source in a liquid-crystal display apparatus.

The LEDs are generally unitized as an LED module and included in various devices. The LED module includes, for example, a substrate and at least one LED element mounted on the substrate.

More specifically, an LED module is known which has a chip on board (COB) structure that includes one or more LED chips (LED elements) mounted directly on a substrate (Patent Literature 1: Japanese Unexamined Patent Application Publication No. 2011-176017). Another known LED module is an LED module in which one or more surface mount device (SMD) LED elements, in each of which an LED chip is housed in a container and packaged, are mounted on a substrate.

SUMMARY

There are instances where a resist is disposed on a surface of a substrate on which LED elements (LED chips) are to be mounted. LED chips are mounted on a resist, for example, through die bonding using a the attach agent (adhesive). In other words, LED elements are bonded on a resist via a the attach agent.

A resist generally includes a resin material. For example, a development-type resist including an epoxy resin which contains a photocurable agent is used for a resin substrate included in the LED module having the COB structure. In addition, it is a general practice to, for example, include a white pigment in a resist to cause the resist to reflect light from an LED element; that is, to enhance efficiency of extracting light from an LED module.

With the development-type resist including an epoxy resin, however, the light reflectance of the resist decreases under a high-temperature or high-humidity environment, leading to a possible problem of deteriorating light-emitting properties of an LED module. Meanwhile, resistance of a resist to heat or light is improved by employing the thermosetting resist. In this case, however, the resist is formed by applying a thermosetting resin to a resin substrate and heating the resin substrate, thus posing a problem of poor accuracy in a shape of the resist (pattern accuracy). Moreover, light reflectance of a resist possibly decreases due to deterioration caused by heat or the like even when the resist is formed using the thermosetting resin, and thus there lies a problem of how to suppress the deterioration.

The present disclosure has been conceived to solve the problems described above, and an object of the present disclosure is to provide a highly reliable LED module.

In order to achieve the above-described object, an LED module according to an aspect of the present disclosure includes: a substrate; a resist including a plurality of layers, above the substrate; and an LED element mounted above the substrate, wherein a content percentage of at least one of a phenyl group, an ester bond, and a carbon double bond in an uppermost layer of the plurality of layers is lower than a content percentage of the at least one of the phenyl group, the ester bond, and the carbon double bond in an underlying layer of the plurality of layers, the underlying layer being located below the uppermost layer.

With the present disclosure, it is possible to implement a highly reliable LED module.

BRIEF DESCRIPTION OF DRAWINGS

The figures depict one or more implementations in accordance with the present teaching, by way of examples only, not by way of limitations. In the figures, like reference numerals refer to the same or similar elements.

FIG. 5 is a partial cross-sectional view of an LED module according to Modification 2.

DETAILED DESCRIPTION OF THE EMBODIMENT

The following describes an embodiment of the present disclosure. It should be noted that the embodiment and modification examples described below each indicate one specific example of the present disclosure. Thus, the numerical values, structural components, the disposition and connection of the structural components, steps, the processing order of the steps, and others described in the following embodiment and the modification examples are mere examples, and do not intend to limit the present disclosure. Furthermore, among the structural components in the following embodiment and the modification examples, structural components not recited in the independent claim which indicates the broadest concept of the present disclosure are described as arbitrary structural components.

In addition, each diagram is a schematic diagram and not necessarily strictly illustrated. In each of the diagrams, substantially the same structural components are assigned with the same reference signs, and redundant descriptions will be omitted or simplified.

Embodiment

Figure 1:
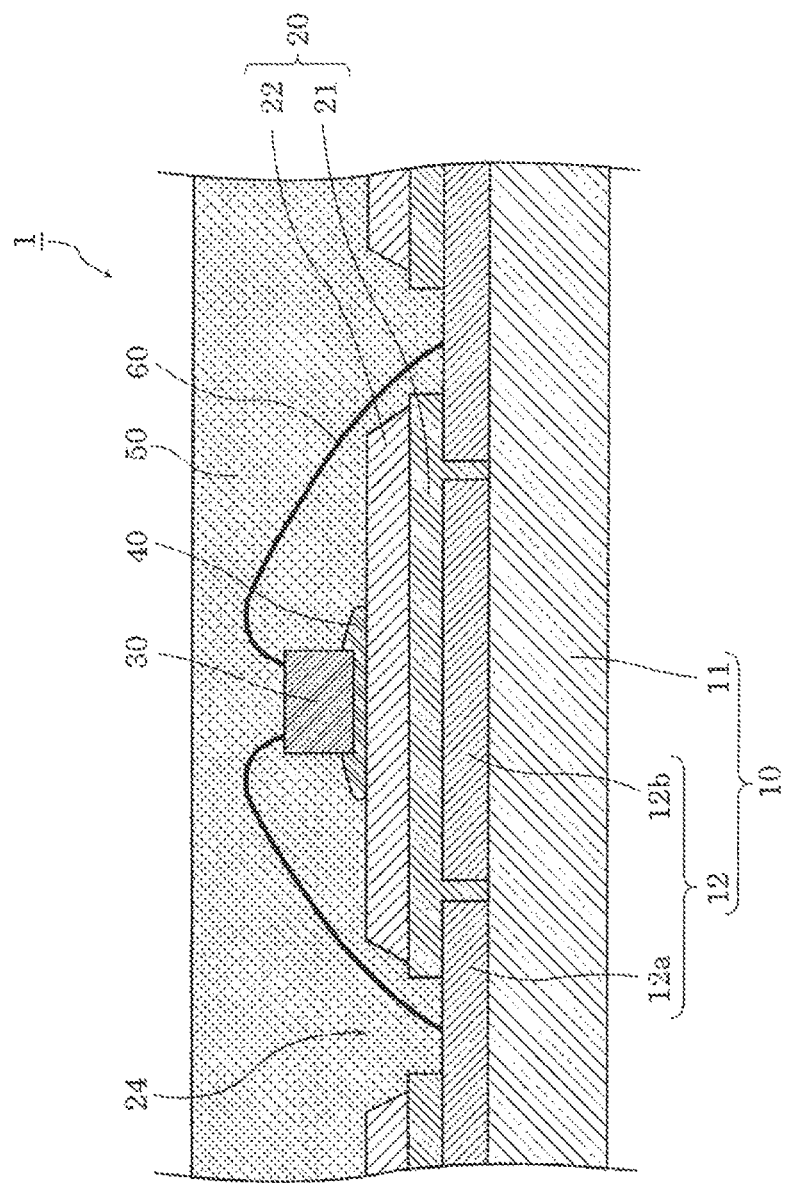
FIG. 1 is a partial cross-sectional view of an LED module according to an embodiment.
Figure 2:
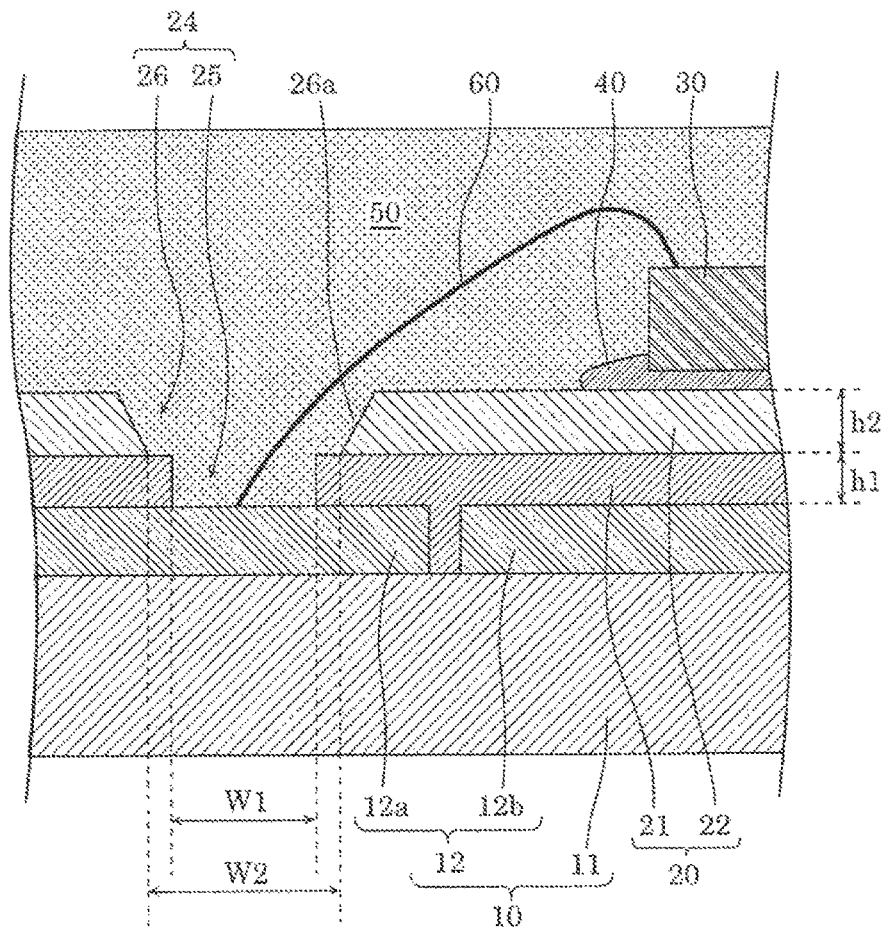
FIG. 2 is a partially enlarged cross-sectional view of the LED module illustrated in FIG. 1.
Figure 3:
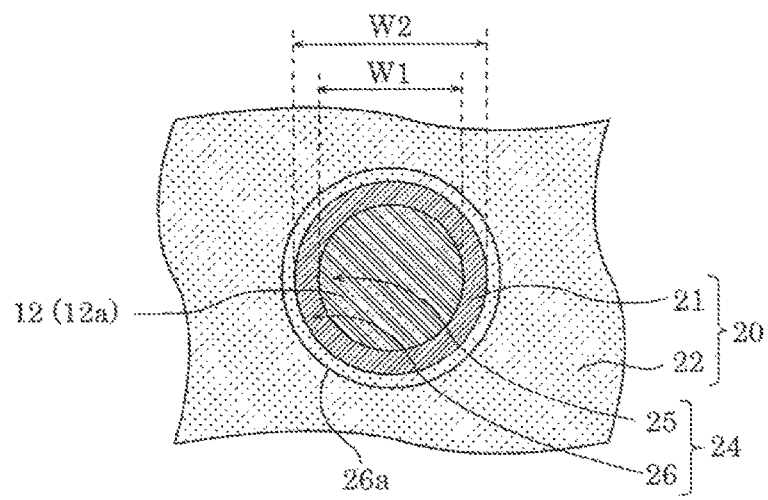
FIG. 3 is a schematic plan view illustrating an opening of a resist according to the embodiment.

The following describes a configuration of LED module 1 according to an embodiment, with reference to FIG. 1 to FIG. 3.

FIG. 1 is a partial cross-sectional view of LED module 1 according to the embodiment. FIG. 2 is a partially enlarged cross-sectional view of LED module 1 illustrated in FIG. 1.

FIG. 3 is a schematic plan view illustrating opening 24 of resist 20 according to the embodiment. It should be noted that FIG. 3 illustrates an example of the shape of opening 24 when resist 20 is viewed from above (i.e., viewed from the side where LED element 30 is disposed on substrate 10), and each component is illustrated with dots, diagonal lines, etc., so as to facilitate distinguishing between the components. In addition, illustration of wire 60 is omitted in FIG. 3.

As illustrated in FIG. 1, LED module 1 includes substrate 10, resist 20, and LED element 30. In the embodiment, LED module 1 further includes adhesive 40 and sealing member 50. LED module 1 emits white light, for example.

Substrate 10 is a mounting substrate for mounting LED element 30. According to the embodiment, substrate 10 is a resin substrate including a resin as a base, and includes resin base 11 (a resin layer) and metal layer 12 formed on a surface of resin base 11.

As resin base 11, the following bases may be used, for example: a glass epoxy base (FR-4) including a glass epoxy formed of a glass fiber and an epoxy resin; a glass composite base (CEM-3); a paper phenol base (FR-1, FR-2) including a craft paper or the like and a phenol resin; a paper epoxy base (FR-3) including a paper and an epoxy resin; a flexible base including polyimide, etc. and having flexibility, etc. Resin base 11 has a thickness of, for example, 1 mm.

Metal layer 12 (metal film) is, for example, a metal line formed on an upper surface of resin base 11 with a pattern having a predetermined shape. Metal layer 12 is, for example, a copper line (copper layer) including copper (Cu). It should be noted that a material of metal layer 12 is not limited to copper, and metal materials other than copper, or other conductive materials may be employed.

In the embodiment, metal layer 12 includes first metal line 12a which is electrically connected to LED element 30 and passes a current therethrough, and second metal line 12b which is electrically disconnected to LED element 30 and does not pass a current therethrough. In other words, second metal line 12b is in a state of electrically floating (i.e., floating state), and thus does not pass a current for light emission of LED element 30.

According to the embodiment, second metal line 12b is disposed under LED element 30. Accordingly, second metal line 12b serves as a heat dissipator for dissipating heat generated by LED element 30. In addition, first metal line 12a also serves as a heat dissipator. It should be noted that second metal line 12b need not be disposed directly beneath LED element 30.

Metal layer 12 may be formed into a predetermined shape through printing or the like, or by etching a portion of a metal film (e.g., copper foil) formed on the entire surface of resin base 11. Metal layer 12 has a thickness of 35 μm, for example.

It should be noted that the shape of substrate 10 having the above-described configuration is not specifically limited, and for example, an elongated rectangle substrate or a regular polygon substrate such as a square substrate may be used as substrate 10. Furthermore, substrate 10 is not limited to a resin substrate, and may be a metal base substrate including metal as a base, a ceramic substrate including a ceramic material such as alumina, a glass substrate including a glass material, etc.

Resist 20 (resist layer) is disposed above substrate 10. According to the embodiment, resist 20 is disposed on a surface of substrate 10. More specifically, resist 20 is disposed on a surface of metal layer 12 to cover metal layer 12 of substrate 10.

Resist 20 has a stacked structure including a plurality of layers. According to the embodiment, resist 20 is composed of two layers which are first layer 21 (i.e. first resist layer) that is the undermost layer and second layer 22 (i.e., second resist layer) that is the uppermost layer. It should be noted that first layer 21 is an example of an underlying layer located below the uppermost layer (second layer 22) in resist 20 including a plurality of layers.

Resist 20 (i.e., first layer 21 and second layer 22) is an insulating film including a resin material having insulation properties. It is possible, by covering metal layer 12 with resist 20, to improve the insulation properties (withstand voltage) of substrate 10, and also possible to suppress oxidation of metal layer 12.

According to the embodiment, resist 20 (i.e., first layer 21 and second layer 22) includes a material having reflectivity for reflecting, off substrate 10, light emitted from LED element 30 when the light returns to substrate 10. For that reason, resist 20 (i.e., first layer 21 and second layer 22) is a white resist including a white resin material in which a white pigment such as titania and silica is included for achieving high reflectance. In this manner, by employing a white resist as resist 20, it is possible to improve light extraction efficiency of LED module 1.

More specifically, first layer 21, which is the undermost layer of resist 20 according to the embodiment, includes a development-type resist material. For that reason, first layer 21 includes a photocurable agent. The photocurable agent includes, for example, sulfur (S), phosphorus (P), nitrogen (N), etc. It is possible to form first layer 21 with excellent pattern accuracy, by employing the development-type resist material.

In this case, the resist material of first layer 21 is an epoxy resin, for example. According to the embodiment, the resist material of first layer 21 is a novolac-type epoxy resin. First layer 21 has a thickness (denoted by h1 in FIG. 2) of 20 μm, for example.

Meanwhile, second layer 22, which is the uppermost layer of resist 20 according to the embodiment, includes a thermosetting resist material. For that reason, second layer 22 includes a thermosetting agent. The thermosetting agent includes an amine compound, an acid anhydride, etc., for example. It is possible to pattern second layer 22 having excellent thermal resistance and light resistance at low cost, by employing the thermosetting resist material.

In this case, the resist material of second layer 22 is also an epoxy resin. According to the embodiment, the resist material of second layer 22 is a novolac-type epoxy resin as with first layer 21. Second layer 22 has a thickness (denoted by h2 in FIG. 2) of 20 μm, for example.

Resist 20 having the above-described configuration has a feature that a content percentage of at least one of a phenyl group, an ester bond, and a carbon double bond in second layer 22 that is the uppermost layer is lower than a content percentage of the at least one of the phenyl group, the ester bond, and the carbon double bond in first layer 21 that is the underlying layer. The advantageous effects produced by the feature will be described later.

LED element 30 is mounted above resist 20 via adhesive 40. More specifically, LED element 30 is mounted above the uppermost layer of resist 20; that is, second layer 22 according to the embodiment. In other words, LED element 30 is mounted above substrate 10 with resist 20 between LED element 30 and substrate 10. In addition, according to the embodiment, adhesive 40 includes an addition-reaction type silicone resin.

According to the embodiment, LED element 30 is an LED chip which emits monochromatic visible light (bare chip). For example, LED element 30 is a blue LED chip which emits blue light when current is supplied, and a semiconductor light-emitting element of gallium nitride (GaN) series having a peak wavelength ranging from 440 nm to 470 nm. In addition, LED element 30 has a single-sided electrode structure in which a p-type electrode and an n-type electrode are both disposed on an upper surface of a nitride semiconductor layer disposed on a sapphire substrate.

In addition, adhesive 40 is a die attach agent (die bond agent), for example. Accordingly, LED element 30 is die-bonded on resist 20 with adhesive 40. Adhesive 40 includes an addition-reaction type silicone resin, for example. According to the embodiment, adhesive 40 includes a platinum catalyst.

In addition, LED element 30 (LED chip) is connected to metal layer 12 of substrate 10 through wire bonding. More specifically, LED element 30 and first metal line 12a of metal layer 12 are connected to each other with wire 60. Wire 60 is a gold wire, for example.

More specifically, wire 60 has one end connected to LED element 30 and the other end connected to a portion of metal layer 12 (first metal line 12a) exposed in opening 24 of resist 20.

It should be noted that only a single LED element 30 may be mounted on substrate 10, or a plurality of LED elements 30 may be mounted on substrate 10. Furthermore, when a plurality of LED elements 30 are mounted, LED elements 30 may be two-dimensionally arranged, such as in a matrix, or may be aligned in one or more straight lines (one dimensionally).

Sealing member 50 seals LED element 30 that is an LED chip. Sealing member 50 includes a wavelength converting material which is excited by light emitted from LED element 30 and emits light having a wavelength different from a wavelength of the light emitted from LED element 30, and a light-transmissive material including the wavelength converting material.

As the light-transmissive material included in sealing member 50, for example, a light-transmissive insulating resin material such as a silicone resin, an epoxy resin, and a fluorinated resin can be employed. The light-transmissive material is not limited to an organic material such as a resin material, and an inorganic material such as a low-melting-point glass and a sol-gel glass may be employed.

The wavelength converting material included in sealing member 50 is a phosphor, for example. The phosphor is included in the light-transmissive material and excited to emit fluorescent light with light emitted by LED element 30 being excitation light, thereby emitting light of a desired color (wavelength).

LED element 30 according to the embodiment is a blue LED chip, and thus an yttrium-aluminum-garnet (YAG) yellow phosphor can be employed as the phosphor for obtaining white light. With this, the wavelength of a portion of the blue light emitted by the blue LED chip is absorbed by the yellow phosphor and converted to yellow light. In other words, the yellow phosphor is excited by blue light emitted from the blue LED chip and emits yellow light. White light is generated as synthetic light which is a mixture of yellow light emitted from the yellow phosphor and blue light that has not been absorbed by the yellow phosphor, and the white light is emitted from sealing member 50.

It should be noted that, sealing member 50 may further include a red phosphor for increasing the color rendering property. In addition, in sealing member 50, light diffusion members such as silica for increasing the light diffusion properties or fillers for suppressing sedimentation of phosphors may be dispersed.

Sealing member 50 according to the embodiment is a phosphor-containing resin including yellow phosphors dispersed to a silicone resin. Sealing member 50 is, for example, applied to substrate 10 using a dispenser to cover LED element 30 mounted above substrate 10, and cured, thereby being formed into a predetermined shape. The cross-section surface of sealing member 50 formed in this manner has a substantially semi-circular shape.

In addition, when a plurality of LED elements 30 are mounted above substrate 10, sealing member 50 may collectively seal LED elements 30. In this case, sealing member 50 may be disposed in a linear shape along the array of LED elements 30, or may be disposed in a circular shape. In addition, sealing member 50 may separately seal LED elements 30 one by one through potting.

LED module 1 configured in this manner is a light-emitting module having the COB structure in which LED element 30, which is an LED chip, is directly mounted above substrate 10.

Substrate 10 may include an electrode terminal for receiving, from outside LED module 1, a DC power for causing LED element 30 to emit light. When the electrode terminal is a metal electrode, the metal electrode is at least partly not covered with resist 20 and exposed from resist 20.

As described above, LED module 1 according to the embodiment includes resist 20 composed of a plurality of layers and is disposed above substrate 10. In addition, a content percentage of at least one of the phenyl group, the ester bond, and the carbon double bond in the uppermost layer (second layer 22) of the plurality of layers is lower than a content percentage of the at least one of the phenyl group, the ester bond, and the carbon double bond in the underlying layer (first layer 21) located below the uppermost layer. It should be noted that the ester bond is recognized as a characteristic group (R—COO—R') of a carboxylate ester.

Here, the resist including a resin material has a white color at the time of manufacturing as a result of including, for example, a white pigment as described above. However, there are instances where the white resist turns yellow due to deterioration caused by, for example, heat generated by the LED element mounted above the resist, leading to a decrease in reflectance of light. As a result of earnest investigation in view of the aforementioned problem, the inventors have conceived a configuration for reducing deterioration of a resist.

More specifically, the inventors have focused on that each of the phenyl group, the ester bond, and the carbon double bond which are included in a skeleton of the resist material is an atom group which accelerates deterioration of a resist, and found out that it is possible to reduce deterioration of the resist by reducing the number of these atom groups.

More specifically, deterioration (oxidation deterioration) of a resist starts upon receiving heat, light, etc., and progresses due to a radical chain reaction. Moreover, a radical is considered to be likely to occur when an atom group such as the above-described phenyl group or the like is present. As a result of investigating the above-described circumstances, the inventors have found that it is possible to achieve both excellent pattern accuracy of a resist and reducing deterioration of the resist, i.e., reducing decrease in light reflectance of the resist, by forming the resist to include a plurality of layers and reducing the number of these atom groups in the uppermost layer.

More specifically, according to the embodiment, when a content percentage (e.g., the number of these atom groups per unit amount, such as a unit weight or a unit volume) of each of the phenyl group, the ester bond, and the carbon double bond is compared between first layer 21 and second layer 22, the content percentage of at least one of the phenyl group, the ester bond, and the carbon double bond in second layer 22 is lower than the content percentage of the at least one of the phenyl group, the ester bond, and the carbon double bond in first layer 21 (including the case where the content percentage of the at least one of the phenyl group, the ester bond, and the carbon double bond in second layer 22 is zero percent). By configuring resist 20 in this manner, it is possible to improve resistance against heat and the like (deterrence against deterioration) of second layer 22 that is the uppermost layer most contributing to reflection of light emitted from LED element 30 among the plurality of layers included in resist 20. As a result, light-emitting properties of LED module 1 are maintained, or deterioration of the light-emitting properties is reduced, for example.

This advantageous effect is exerted in a region where, for example, light emitted from LED element 30 reaches resist 20. In other words, even when a resist above which LED element 30 is not mounted is disposed on substrate 10, it is sufficient that the content percentage of at least one of a phenyl group, an ester bond, and a carbon double bond in the uppermost layer of the plurality of layers included in the resist is lower than the content percentage of the at least one of the phenyl group, the ester bond, and the carbon double bond in the underlying layer. With this configuration, deterioration is reduced in the uppermost layer of the resist, and as a result, a decrease in light reflectance of the resist is reduced.

Here, when turning yellow of a surface of the resist is observed, the surface absorbs light having a wavelength ranging approximately from 400 nm to 480 nm. Accordingly, the configuration of resist 20 according to the embodiment is effective as a countermeasure against a decrease in light reflectance in the case where light emitted from LED element 30 and entering the uppermost layer (second layer 22) has a peak wavelength equal to or less than 480 nm, for example.

In addition, assume the case where, when the content percentage of each of the phenyl group, the ester bond, and the carbon double bond is compared between first layer 21 and second layer 22, the content percentage of one or two of the phenyl group, the ester bond, and the carbon double bond in second layer 22 is lower than the content percentage of the one or two of the phenyl group, the ester bond, and the carbon double bond in first layer 21. In this case, as to the other one or two of the phenyl group, the ester bond, and the carbon double bond, the content percentage in second layer 22 may be equal to or lower than the content percentage in first layer 21. In this manner, the effect of reducing a decrease in light reflectance of the uppermost layer (second layer 22) of resist 20 is further enhanced.

In addition, when the content percentage of each of the phenyl group, the ester bond, and the carbon double bond is compared between first layer 21 and second layer 22, the content percentage of each of the atom groups in second layer 22 may be lower than the content percentage in first layer 21. In this manner, the effect of reducing a decrease in light reflectance of the uppermost layer (second layer 22) of resist 20 is further enhanced.

There is no particular limitation on how to compare the content percentage of each of the phenyl group, the ester bond, and the carbon double bond between first layer 21 and second layer 22. For example, the comparison may be carried out based on a result of measurement performed using an infrared absorption analysis method.

The content percentage of each of the phenyl group, the ester bond, and the carbon double bond in first layer 21 or second layer 22 is adjusted by, for example, changing the type or amount of amine compounds included as a thermosetting agent, or changing the type or amount of used materials of a novolac-type epoxy resin.

In addition, according to the embodiment, second layer 22 of resist 20 includes a thermosetting resist material, and LED element 30 is mounted above second layer 22 via adhesive 40.

Second layer 22 formed using a thermosetting resist material has more excellent thermal resistance, light resistance, etc., than in the case where second layer 22 is formed using a development-type resist material. Moreover, as described above, it is designed so that the number of atom groups which progress deterioration of second layer 22 is reduced, and thus the properties such as the thermal resistance inherent in the thermosetting resist material are also maintained.

Furthermore, since second layer 22 includes the thermosetting resist material, an advantageous effect of improving adhesion strength between LED element 30 and resist 20 is also obtained. The following describes this advantageous effect.

According to the embodiment, second layer 22 of resist 20 is formed using the thermosetting resist material, and thus second layer 22 does not include a photocurable agent. Accordingly, in second layer 22, nitrogen is contained as a portion of the thermosetting agent, but sulfur and phosphorus are not substantially contained. In contrast, first layer 21 is formed using the development-type resist material, and thus first layer 21 includes a photocurable agent. The photocurable agent includes sulfur, phosphorus, and nitrogen. In the photocurable agent, sulfur and phosphorus each serve as a photopolymerization initiator, and nitrogen is present as an amine compound and serves as a curing agent. Accordingly, first layer 21 includes each of sulfur, phosphorus, and nitrogen. This means that, with LED module 1 according to the embodiment, a higher positioned layer of the plurality of layers in resist 20 is lower in at least one of sulfur content, phosphorus content, and nitrogen content than a lower positioned layer of the plurality of layers included in resist 20.

In addition, LED element 30 is mounted above resist 20 using adhesive 40 including an addition-reaction type silicone resin.

Sulfur, phosphorus, and nitrogen are materials which inhibit curing of adhesive 40 including an addition-reaction type silicone resin. Accordingly, it is possible to suppress inhibition of curing of adhesive 40, by reducing each of the sulfur content, the phosphorus content, and the nitrogen content in the uppermost layer (second layer 22) of resist 20 to which adhesive 40 is adhered. In this manner, the adhesion strength between LED element 30 and resist 20 is ensured, and thus highly reliable LED module 1 can be implemented.

In addition, according to the embodiment, adhesive 40 which causes LED element 30 to adhere to resist 20 includes a platinum-based catalyst which promotes curing. For example, in adhesive 40 including an addition-reaction type silicone resin, silicone polymer having a vinyl group (base compound) and silicone polymer having an H group (curing agent) are cured by hydroxylation reaction with platinum-based catalyst.

According to experimental results of the inventors, inhibition of curing due to sulfur, phosphorus, and nitrogen is more likely to occur when the platinum-based catalyst is included in adhesive 40. This is thought to be due to deactivation of the platinum-based catalyst caused by sulfur, phosphorus, and nitrogen, which decreases the effect of catalyst, and thus makes curing reaction difficult to advance.

Accordingly, when adhesive 40 includes the platinum-based catalyst, each of the sulfur content, the phosphorus content, and the nitrogen content is set lower in a higher positioned layer of the plurality of layers of resist 20 than a lower positioned layer of the plurality of layers of resist 20, thereby improving the effect of suppressing inhibition of curing of adhesive 40.

In addition, according to the embodiment, the underlying layer (first layer 21) of resist 20 includes a development-type resist material.

Here, the underlying layer of resist 20 is disposed closer to substrate 10 than the uppermost layer, and thus required to have pattern accuracy higher than that of the uppermost layer. According to the embodiment, first layer 21 is the undermost layer of resist 20 and directly covers metal layer 12 of substrate 10. Accordingly, the development-type resist material is adopted as a material of first layer 21 that is the undermost layer of resist 20, thereby easily improving the pattern accuracy of the undermost layer. This allows implementing LED module 1 which is more highly reliable.

In addition, according to the embodiment, the resist material of the underlying layer (first layer 21) of resist 20 is an epoxy resin.

This allows to, for example, harden resist 20, and thus it is possible to decrease the possibility of denting of resist 20 when LED element 30 is mounted above resist 20. As a result, it is possible to mount LED element 30 above resist 20 with accuracy, enabling implementing LED module 1 which is more highly reliable.

In addition, according to the embodiment, substrate 10 includes metal layer 12 disposed under resist 20, and resist 20 includes opening 24 which exposes a portion of metal layer 12. As illustrated in FIG. 2 and FIG. 3, for example, opening 24 includes first opening 25 in the underlying layer (first layer 21) and second opening 26 in the uppermost layer (second layer 22) which is larger than first opening 25 and located above first opening 25.

More specifically, resist 20 includes opening 24 which exposes a portion of first metal line 12a that is used for supplying power to LED element 30 and is included in metal layer 12 covered by resist 20. In addition, opening 24 includes first opening 25 and second opening 26, and is, for example, a circular-shaped opening when viewed from above as illustrated in FIG. 3.

In opening 24 configured in this manner, inner diameter W2 of second opening 26 is larger than inner diameter W1 of first opening 25. This means that, when second layer 22 is formed, the thermosetting resist material applied to first layer 21 does not extend inward of first opening 25; that is, the resist material does not drip down into first opening 25.

More specifically, according to the embodiment, first layer 21 which directly covers metal layer 12 of substrate 10 includes the development-type resist material, and second layer 22 includes the thermosetting resist material. In this case, for example, the paste-like resist material possibly drips down into first opening 25 between applying of the thermosetting resist material to first layer 21 and completion of curing. However, according to the embodiment, the resist material is applied in such a manner that inner diameter W2 of second opening 26 is larger than inner diameter W1 of first opening 25. This configuration decreases the possibility of the resist material dripping down into first opening 25, and thus the possibility of defect that, for example, the portion of metal layer 12 exposed in opening 24 of metal layer 12 is partly or entirely covered by the resist material that configures second layer 22 is reduced.

According to the embodiment, an edge of second opening 26 has tapered portion 26a inclined outwardly (i.e., in a direction away from the center of second opening 26) and upwardly, as illustrated in FIG. 2 for example. LED element 30 is connected to the portion of metal layer 12 exposed in opening 24 through wire bonding.

Accordingly, in the embodiment, the portion of metal layer 12 exposed in opening 24 serves as a portion for supplying power to LED element 30. More specifically, as illustrated in FIG. 2, wire 60 for supplying power to LED element 30 is connected to first metal line 12a through opening 24. In this configuration, tapered portion 26a is included in second opening 26 provided in second layer 22 that is the uppermost layer of resist 20. This decreases the possibility that an edge of opening 24 hinders an operation of mounting wire 60, for example. In other words, the operation of mounting wire 60 is efficiently carried out.

According to the embodiment, substrate 10 includes resin base 11 and metal layer 12 formed on a surface of resin base 11. With this configuration, it is possible to implement LED module 1 including substrate 10 that is a resin substrate. Furthermore, since resist 20 is disposed on the surface of metal layer 12, it is possible to improve the insulation properties (withstand voltage) of substrate 10, and also possible to suppress oxidation of metal layer 12. This allows implementing LED module 1 which is more highly reliable.

According to the embodiment, resist 20 is composed of two layers which are first layer 21 that is the undermost layer and second layer 22 that is the uppermost layer.

This configuration allows, with resist 20 having the smallest stacked structure (two-layer structure), the layers (i.e., first layer 21 and second layer 22) to have functions different from each other. For example, according to the embodiment, it is possible to configure first layer 21 (the undermost layer) with the development-type resist material and second layer 22 (the uppermost layer) with the thermosetting resist material. With this configuration, it is possible to ensure pattern accuracy in first layer 21 and also ensure resistance against heat and the like in second layer 22. Accordingly, it is possible to form resist 20 with excellent pattern accuracy and implement LED module 1 with excellent resistance against heat and the like. This allows implementing LED module 1 which is more highly reliable.

It is described in the embodiment that thickness h1 of first layer 21 that is the undermost layer and thickness h2 of second layer 22 that is the uppermost layer are both approximately 20 μm. However, thickness h2 of second layer 22 that is the uppermost layer may be greater than thickness h1 of first layer 21 that is the undermost layer.

With this configuration, it is possible, for example, to improve the thermal resistance and also easily maintain the light-emitting properties of LED module 1. Furthermore, it is possible to protect first layer 21 by second layer 22. More specifically, for example, first layer 21 which is lower in resistance against heat and the like than second layer 22 is further protected by second layer 22, thereby suppressing deterioration of first layer 21 due to heat and the like. This allows implementing LED module 1 which is more highly reliable.

In the embodiment, LED module 1 further includes sealing member 50 which seals LED element 30.

With this configuration, it is possible to protect LED element 30 with sealing member 50. Moreover, by including a wavelength converting material such as a phosphor into sealing member 50, it is possible to implement LED module 1 which emits light having a color different from a color of light emitted by LED element 30.

Modification 1

Figure 4:
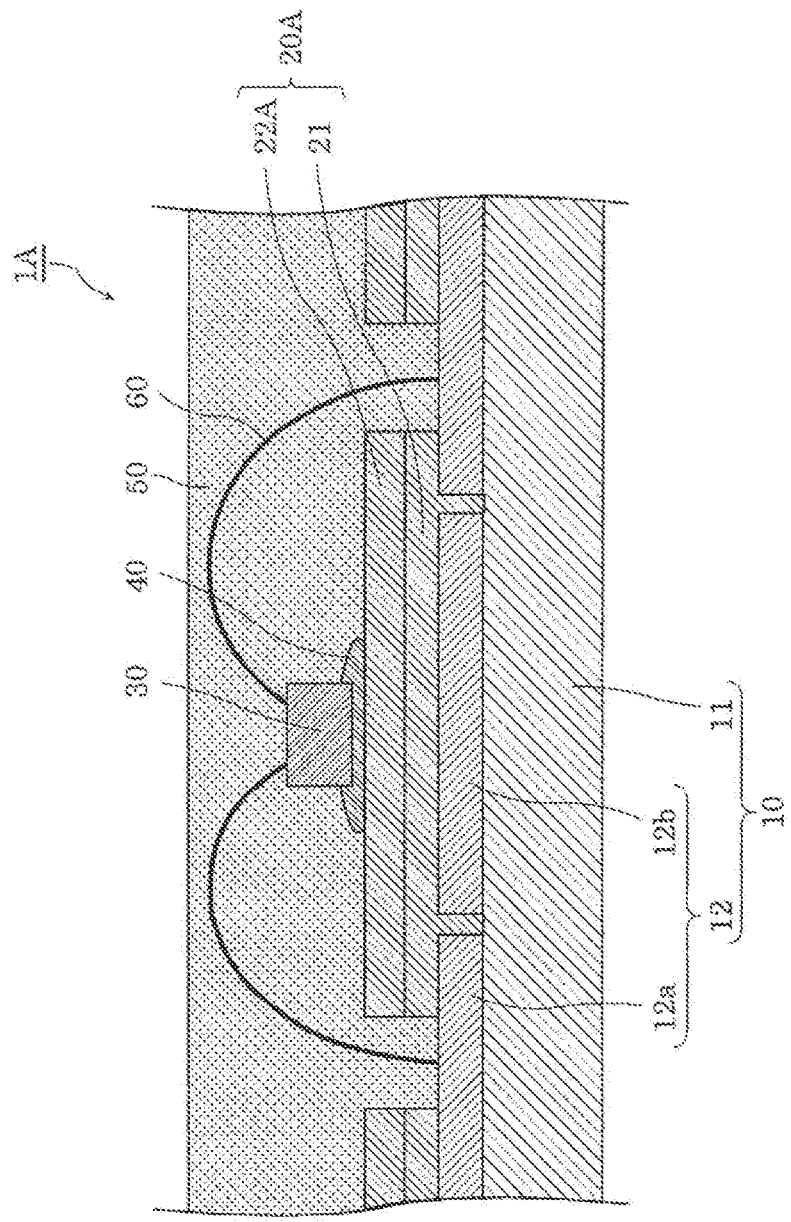
FIG. 4 is a partial cross-sectional view of an LED module according to Modification 1.

FIG. 4 is a partial cross-sectional view of LED module 1 according to Modification 1.

According to the above-described embodiment, resist 20 of LED module 1 includes first layer 21 and second layer 22 which are formed using different resist materials. In contrast, according to the present modification, resist 20A of LED module 1A includes first layer 21 and second layer 22A which are formed using the same resist material.

More specifically, first layer 21 and second layer 22A both include the development-type resist material, according to the present modification. For example, the novolac-type epoxy resin may be employed as the resist material of first layer 21 and second layer 22A.

In addition, in the same manner as above-described embodiment, the content percentage of at least one of a phenyl group, an ester bond, and a carbon double bond in second layer 22A which is the uppermost layer is lower than the content percentage of the at least one of the phenyl group, the ester bond, and the carbon double bond in first layer 21 which is the underlying layer, according to the present modification as well.

With this configuration, it is possible to improve resistance against heat and the like (deterrence against deterioration) of second layer 22A that is the uppermost layer most contributing to reflection of light emitted from LED element 30, among the plurality of layers included in resist 20A, in LED module 1A according to the present modification as well As a result, it is possible, for example, to maintain the light-emitting properties of LED module 1A or suppress deterioration of LED module 1A. This allows implementing LED module 1A which is highly reliable.

In addition, according to the present modification, since first layer 21 and second layer 22A of resist 20A both include the development-type resist material, it is possible, for example, to further improve the pattern accuracy of resist 20 compared to the above-described embodiment.

Modification 2

FIG. 5 is a partial cross-sectional view of LED module 1B according to Modification 2.

According to the above-described embodiment, resist 20 of LED module 1 has the two-layer structure including first layer 21 and second layer 22. In contrast, according to the present modification, resist 20B of LED module 1B has a three-layer structure including first layer 21 that is the undermost layer, second layer 22 that is the uppermost layer, and third layer 23 that is an interlayer. More specifically, resist 20B according to the present modification includes third layer 23 as the interlayer between first layer 21 and second layer 22 included in resist 20 according to the above-described embodiment.

The resist materials of first layer 21 and second layer 22 according to the present modification are the same as the resist materials described in the above-described embodiment. For example, first layer 21 includes a development-type resist material, and second layer 22 includes a thermosetting resist material. In addition, the resist materials included in first layer 21 and second layer 22 are both the novolac-type epoxy resin.

Third layer 23 includes the development-type resist material, according to the present modification. More specifically, the resist material included in third layer 23 is the novolac-type epoxy resin. It should be noted that third layer 23 may include the thermosetting resist material.

In addition, in the same manner as the above-described embodiment, the content percentage of at least one of the phenyl group, the ester bond, and the carbon double bond in second layer 22 which is the uppermost layer is lower than the content percentage of the at least one of the phenyl group, the ester bond, and the carbon double bond in first layer 21 or third layer 23 which are the underlying layers, according to the present modification as well.

With this configuration, it is possible to improve resistance against heat and the like (deterrence against deterioration) of second layer 22 that is the uppermost layer most contributing to reflection of light emitted from LED element 30 among the plurality of layers included in resist 20, in LED module 1B according to the present modification as well As a result, it is possible, for example, to maintain the light-emitting properties of LED module 1B or suppress deterioration of LED module 1B. This allows implementing LED module 1B which is highly reliable.

Others

The LED module according to the present disclosure has been described based on the embodiment and modifications as above; however, the present disclosure is not limited to the above-described embodiment and modifications.

For example, although the novolac-type epoxy resin is employed as the material of resist 20 (first layer 21 and second layer 22) in the above-described embodiment and modifications, the material of resist 20 is not limited to the novolac-type epoxy resin. As the material of resist 20, for example, a bisphenol A type epoxy resin may be employed.

In addition, although resist 20 and resist 20A each have the two-layer structure and resist 20B has the three-layer structure in the above-described embodiment and modifications, the structure of the resist is not limited to these examples. For example, the resist may include four or more layers.

Furthermore, although the LED module having the COB structure including LED element 30 as an LED chip directly mounted on substrate 10 is exemplified in the above-described embodiment and modifications, the LED module is not limited to this example. For example, an SMD LED element in which an LED chip is individually packaged may be employed as LED element 30, and the LED module may include one or more LED elements 30 mounted on substrate 10.

In this case, LED element 30 which is the SMD LED element includes, for example, a container including a white resin and having a cavity, an LED chip (e.g., a blue LED chip) mounted in the cavity of the container, and a sealing member (e.g., a yellow phosphor-containing resin) filling the cavity of the container.

In addition, although LED module 1 (LED element 30) according to the above-described embodiment and modifications emits white light using the blue LED chip and the yellow phosphor, the present disclosure is not limited to this example. For example, white light may be emitted by using a phosphor-containing resin including a red phosphor and a green phosphor, and combining the phosphor-containing resin and the blue LED chip. Furthermore, an LED chip which emits color of light other than blue may be employed. Alternatively, white light may be generated by combining an ultraviolet LED chip which emits ultraviolet light having a shorter wavelength than light emitted by the blue LED chip and phosphors which respectively emit the three primary colors (red, green and blue) by being excited mainly by ultraviolet light.

In addition, although a phosphor is employed as the wavelength converting material according to the above-described embodiment and modifications, the wavelength converting material is not limited to the phosphor. As the wavelength converting material, for example, a material including a substance which absorbs light of a certain wavelength such as a semiconductor, a metal complex, an organic dye, and a pigment, and emits light of a wavelength different from the wavelength of the absorbed light.

In addition, the LED module according to the above-described embodiment and modifications may be employed as an illumination light source for a lighting device (lighting apparatus) such as a downlight, spotlight, and base light. Moreover, the LED module may also be used as a light source for purposes other than illumination purpose, such as a backlight light source for a liquid-crystal display apparatus or the like, a lamp light source for a copy machine or the like, a light source for a guide light or a signboard device.

It should be noted that the present disclosure also includes other forms in which various modifications apparent to those skilled in the art are applied to the above-described embodiment and modification examples or forms in which structural components and functions in the above-described embodiment and modification examples are arbitrarily combined within the scope of the present disclosure.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A light emitting diode (LED) module, comprising:
   a substrate;
   a resist including a plurality of layers, above the substrate; and
   an LED element mounted above the resist, wherein
   a content percentage of at least one of a phenyl group, an ester bond, and a carbon double bond in an uppermost layer of the plurality of layers is lower than a content percentage of the at least one of the phenyl group, the ester bond, and the carbon double bond in an underlying layer of the plurality of layers, the underlying layer being located below the uppermost layer,
   the substrate includes a metal layer disposed under the resist,
   the resist includes an opening which exposes a portion of the metal layer,
   the opening includes a first opening in the underlying layer and a second opening in the uppermost layer, the second opening being located above and larger than the first opening,
   an edge of the second opening has a tapered portion inclined outwardly and upwardly, and
   the LED element is connected to the portion of the metal layer exposed by the opening, through wire bonding.

2. The LED module according to claim 1, wherein
   the uppermost layer of the resist includes a thermosetting resist material, and
   the LED element is mounted above the uppermost layer via an adhesive.

3. The LED module according to claim 1, wherein
   the underlying layer of the resist includes a development-type resist material.

4. The LED module according to claim 3, wherein
   the development-type resist material included in the underlying layer of the resist is an epoxy resin.

5. The LED module according to claim 1, wherein
   the substrate includes a resin base having a surface on which the metal layer is disposed.

6. The LED module according to claim 1, wherein
   the resist is composed of two layers, the two layers being the uppermost layer and the underlying layer that is an undermost layer.

7. The LED module according to claim 6, wherein
   the uppermost layer has a thickness greater than a thickness of the underlying layer.

8. The LED module according to claim 1, further comprising
   a sealing member which seals the LED element.

9. The LED module according to claim 1, wherein
   light emitted by the LED element and entering the uppermost layer has a peak wavelength less than or equal to 480 nm.

* * * * *